United States Patent [19]

Wurcer

[11] Patent Number: 5,166,637
[45] Date of Patent: Nov. 24, 1992

[54] DISTORTION CANCELLATION AMPLIFIER SYSTEM

[75] Inventor: Scott A. Wurcer, Cambridge, Mass.
[73] Assignee: Analog Devices, Inc., Norwood, Mass.
[21] Appl. No.: 852,994
[22] Filed: Mar. 16, 1992
[51] Int. Cl.⁵ .............................................. H03F 3/45
[52] U.S. Cl. ..................................... 330/257; 330/149; 330/260
[58] Field of Search ................ 330/257, 149, 260, 294

[56] References Cited

U.S. PATENT DOCUMENTS

| | | | |
|---|---|---|---|
| 4,163,948 | 8/1979 | Rieger et al. | 330/260 |
| 4,438,349 | 3/1984 | Shoji | 330/257 |
| 4,462,002 | 7/1984 | Schade, Jr. | 330/257 |
| 4,628,279 | 12/1986 | Nelson | 330/260 |

Primary Examiner—Paul M. Dzierzynski
Assistant Examiner—Tan Dinh
Attorney, Agent, or Firm—Iandiorio and Dingman

[57] ABSTRACT

A distortion cancellation amplifier system operational amplifier system includes a current mirror circuit having an input, an output and a common terminal; a device for providing a pair of differential current signals to the input and output terminals of the current mirror circuit; a control device, responsive to said output terminal of the current mirror circuit, for controlling the voltage at the common terminal to drive the voltage at the input terminal of said current mirror circuit to track the voltage on the output terminal of the current mirror circuit; an output amplifier stage having a predetermined gain and having an input and an output terminal with its input terminal connected to the output terminal of the current mirror circuit; a gain control device having a predetermined impedance connected with the input terminal of the output amplifier; and a distortion suppression device connected between the output terminal of the output amplifier and the input terminal of the current mirror circuit and having an impedance equal to the predetermined impedance of the gain control device divided by the predetermined gain of the output amplifier for cancelling signal distortion introduced by the output amplifier stage.

12 Claims, 2 Drawing Sheets

DISTORTION CANCELLATION AMPLIFIER SYSTEM

FIELD OF INVENTION

This invention relates to a distortion cancellation amplifier system, and more particularly to such an amplifier system which cancels distortions introduced by the output amplifier stage, and which is especially applicable to operational amplifiers.

BACKGROUND OF INVENTION

Many conventional amplifiers including operational amplifiers employ an output buffer amplifier which is driven by a current mirror circuit. The current mirror circuit is in turn driven by a pair of differential current signals, usually obtained from a voltage to current differential amplifier. A gain control/frequency compensation device, for example a capacitor, a resistor, or a network including capacitors, resistors, and other elements, is connected to the output of the current mirror circuit for shaping the response with respect to both amplitude and frequency characteristics of the amplifier.

In order to improve the gain factor of such operational amplifiers to a theoretically infinite gain, a gain control device is used which includes a bias circuit that biases the third common terminal of the current mirror circuit and includes a voltage follower or a similar device which responds to the voltage at the output of the current mirror circuit to vary the bias on the common terminal of the current mirror and thereby drive the voltage on the input terminal of the current mirror circuit to track that on the output terminal of the current mirror circuit. As a result, the amplifier provides a large gain, virtually infinite, as it attempts to drive the voltage on the current mirror input terminal to track that on the output terminal, and null the difference in the differential input currents While this improved operational amplifier with the floating current mirror circuit does provide a much increased gain, it still suffers from the problem of distortion introduced in the output buffer amplifier. In normal use an external passive network is used in conjunction with the operational amplifier completing what is known as a feedback loop. This distortion thusly occurs internal to the feedback loop and distorts the overall performance. One technique that has been used to deal with such distortion in the past is to increase the quiescent power provided to the output amplifier stage, in order to minimize the distortion generated, but this increases the power consumption without increasing the power output and sacrifices the efficiency of the amplifier.

SUMMARY OF INVENTION

It is therefore an object of this invention to provide a distortion cancellation amplifier system which cancels voltage distortion arising in the output amplifier stage.

It is a further object of this invention to provide such a distortion cancellation amplifier system which greatly reduces the output impedance.

It is a further object of this invention to provide such a distortion cancellation amplifier system which eliminates distortion involving both differential phase and differential gain.

It is a further object of this invention to provide such a distortion cancellation amplifier system which passively decreases distortion without increase in quiescent power.

It is a further object of this invention to provide a low power, low distortion amplifier system by passive distortion cancellation.

The invention results from the realization that a truly simple, passive cancellation of distortion in the output amplifier stage of an amplifier system can be achieved by connecting, between the output of the output amplifier stage and an input of a current mirror circuit, an internal feedback network whose impedance is equal to that of the gain control network at the input of the output amplifier stage divided by the gain of that stage, in order to cancel the effect of distortion in the output amplifier stage by mirroring the distortion current in the feedback network to provide at the input to the output amplifier stage a current equal and opposite to that caused by the distortion.

This invention features a distortion cancellation amplifier system including a current mirror circuit having an input, an output and a common terminal and means for providing a pair of differential current signals to the input and output terminals of the current mirror circuit. There are control means, responsive to the output terminal of the current mirror circuit, for controlling the voltage at the common terminal to drive the voltage at the input terminal of the current mirror circuit to track the voltage on the output terminal of the current mirror circuit. An output amplifier stage has a predetermined gain and an input and an output terminal with its input terminal connected to the output terminal of the current mirror circuit. A gain control device has a predetermined impedance connected with the input terminal of the output amplifier. A distortion suppression device is connected between the output terminal of the output amplifier and the input terminal of the current mirror circuit and has an impedance equal to the predetermined impedance of the gain control device divided by the predetermined gain of the output amplifier for cancelling the distortion introduced by the output amplifier stage.

In a preferred embodiment the means for providing a pair of differential current signals includes a voltage to current transductance amplifier for providing a pair of differential current signals in response to a pair of differential input voltages. The means for providing a pair of differential current signals may also include first and second bias circuits, one interconnected with each of the input and output terminals of the current mirror circuit. The control means may also include a voltage follower circuit having its input responsive to the output terminal of the current mirror circuit, and its output connected to the common terminal of the current mirror circuit. The control means may further include a third bias circuit connected to the common terminal of the current mirror circuit. The gain control device may include a capacitor, or a resistor, or a network including two or more such devices. The distortion suppression device may include a capacitor, a resistor, or a network including two or more such devices.

In a more specific implementation, the invention relates to such a distortion cancellation amplifier system in the form of a folded cascode operational amplifier.

DISCLOSURE OF PREFERRED EMBODIMENT

Other objects, features and advantages will occur to those skilled in the art from the following description of a preferred embodiment and the accompanying drawings, in which.

Figure 1:
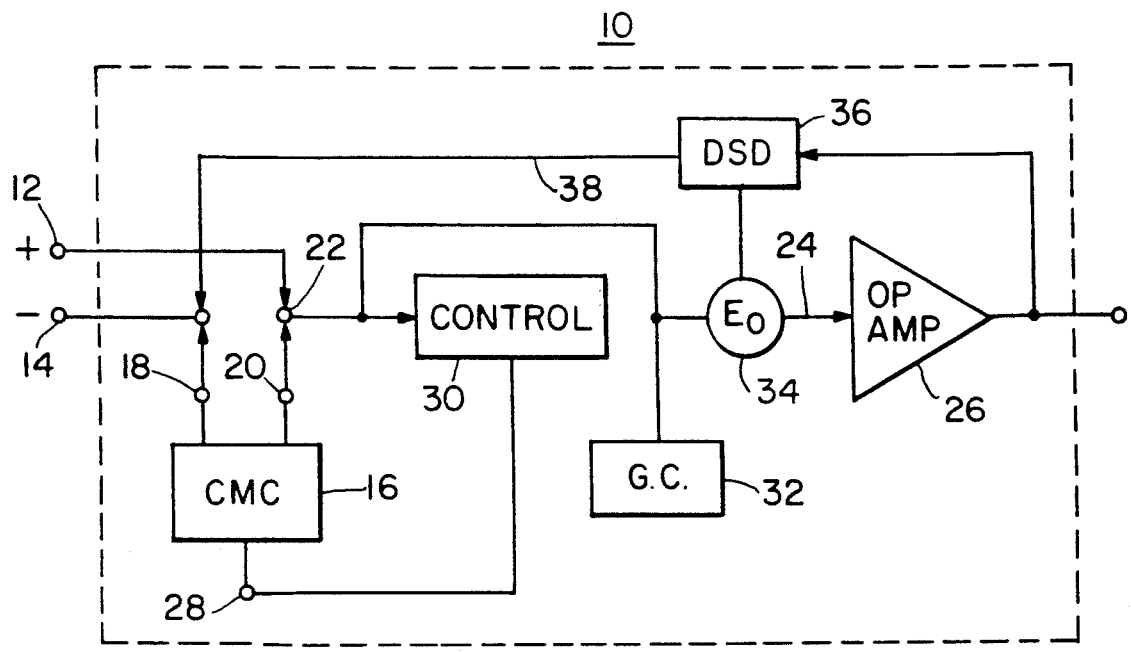
FIG. 1 is a schematic block diagram of a distortion cancellation amplifier system according to this invention.

There is shown in FIG. 1 a distortion cancellation amplifier 10 according to this invention implemented in the form of an operational amplifier such as a single-stage folded cascode amplifier. A pair of differential currents supplied at input terminals 12 and 14 are provided to current mirror circuit 16. The negative current at the input terminal 18 of current mirror circuit 16 is exactly mirrored at its output terminal 20. The current at output terminal 20 combines at node 22 with the equal and opposite current coming from terminal 12. These currents, as a result of the high impedance at node 22, provide a large voltage to the input 24 of output amplifier stage 26. Thus in the conventional manner of operational amplifiers, the very small difference in the currents at input terminals 12 and 14 provide a large voltage at node 22 and thus at input 24 of amplifier 26. This causes amplifier 26 to provide a large output, with gains at least of an order of magnitude of 1,000 or more. In addition, in accordance with improved virtually infinite gain operational amplifier design, the third or common terminal 28 of current mirror circuit 16 is controlled by a control circuit 30. A quiescent bias is maintained at terminal 28 and control circuit 30 varies this bias so that the otherwise fixed output voltage at terminal 18 is made to track the voltage at node 22. The previously mentioned typically high impedance at node 22 can, by design, be made to virtually identically match that at node 18. This acts in conjunction with the control circuit 30 to cause the voltage at node 22, and therefore the output of amplifier 26, to constantly increase in response to the difference in current supplied at the input terminals of 12 and 14 yielding the virtually infinite gain, i.e., an arbitrarily large voltage at node 22 caused by an arbitrarily small difference in input currents.

The system also contains a gain control circuit 32 which controls the magnitude and phase of the signal supplied to the input 24 of amplifier 26, which determines both the magnitude and phase of the amplifier response. In such a system, there are distortions, as represented by the distortion $E_O$ 34, introduced by output amplifier stage 26 which have been previously addressed by increasing the quiescent power consumption of amplifier 26.

In accordance with this invention, the distortion represented by $E_O$ at 34 is fed back through a distortion suppression device 36 through internal feedback loop 38 to the input terminal 18 of the current mirror circuit 16. Through the inherent operation of current mirror circuit 16, the current in the gain control/frequency compensation network will be equal to the current in the distortion suppression device; the distortion signal $E_O$ is therefore reflected at the output terminal 20 of current mirror circuit 16, equal in magnitude but opposite in sign, i.e., $-E_O$. This is fed back to the gain control circuit 32 and the input 24 of output amplifier 26 so that it just cancels the distortion signal $E_O$ introduced by amplifier 26. It is then seen that for any $E_O$, in FIG. 2, the voltage at nodes 18 and 20 will be at $-E_O$, while the voltage at the output of the output amplifier stage 26 remains unchanged which is the desired result. In order for the cancellation to be complete, it is important that the impedance characteristics of the distortion suppression device 36 be the same as that of the gain control device 32 in proportion to the gain. That is, if output amplifier stage has a voltage gain of unity the two impedances would be made equal. If the gain is two then the impedance of circuit 36 would be half that of circuit 32: the impedance of circuit 36 is equal to that of circuit 32 divided by the gain of stage 26.

Figure 2:
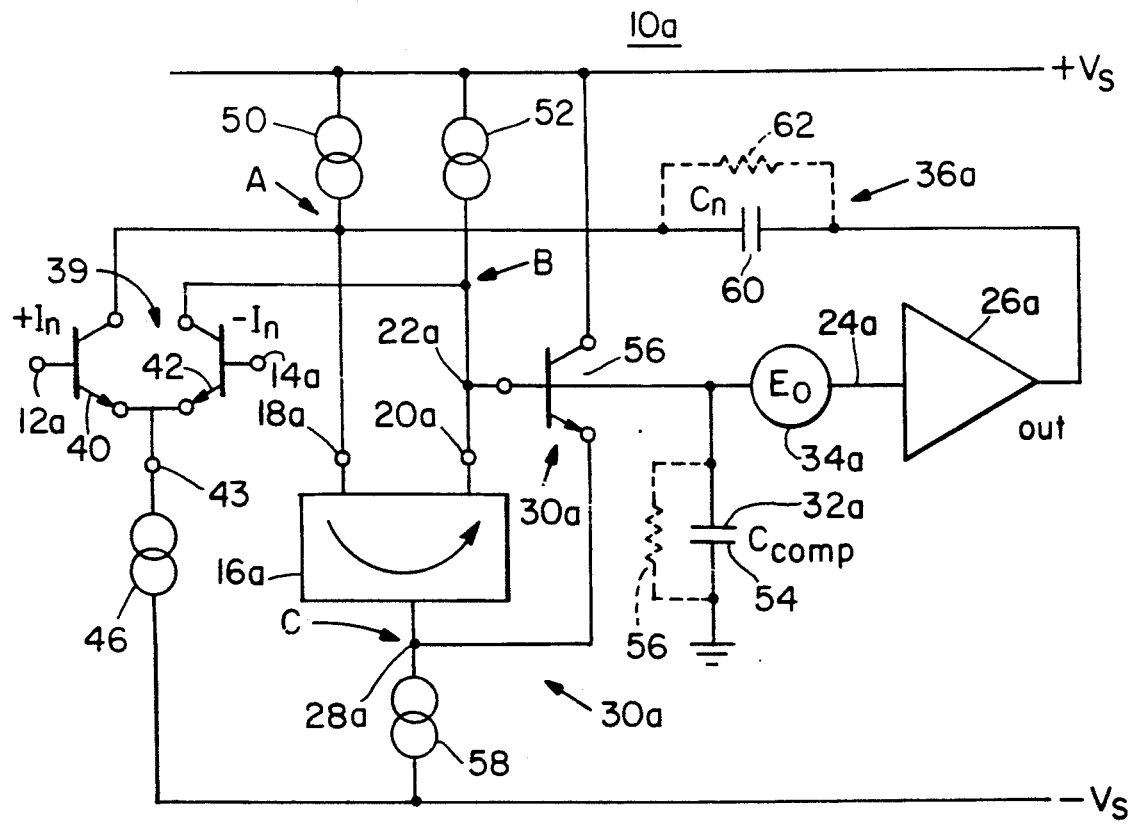
FIG. 2 is a more detailed schematic block diagram of the system of FIG. 1.

The distortion cancellation amplifier system 10 is shown in more detail, system 10a, in FIG. 2, where the means for providing a pair of differential current signals includes a voltage-to-current differential amplifier 39 utilizing two NPN transistors 40 and 42 differentially connected with their emitters commonly connected at terminal 43 to a biasing current source 46. The outputs from voltage-to-current amplifier 39 are provided to the input 18a and output 20a terminals of current mirror 16a. Also interconnected with terminals 18a and 20a are biasing circuits 50, 52. Gain control/frequency shaping circuit 32a may include a capacitor 54 or a resistor 56, or both. It may as well include any combination or network of elements for accomplishing the gain control and shaping functions in such amplifiers as is well known to those skilled in the art. Control circuit 30a may include an NPN transistor 56 which responds to the voltage at terminal 22a to vary the quiescent voltage at terminal 28a established by quiescent biasing circuit 58 to cause input terminal 18a of current mirror circuit 16a to track the voltage at output terminal 20a and thus the voltage at node 22a, and at the input 24a to output amplifier stage 26a. The distortion suppression device 36a may include a capacitor 60 or a resistor 62, or both, or a more complex network, so long as it is equivalent in its electrical characteristics to gain control 32a. When the two are equal in electrical characteristics, their response to the distortion signal $E_O$ is identical and so virtually perfect cancellation will occurs.

Figure 3:
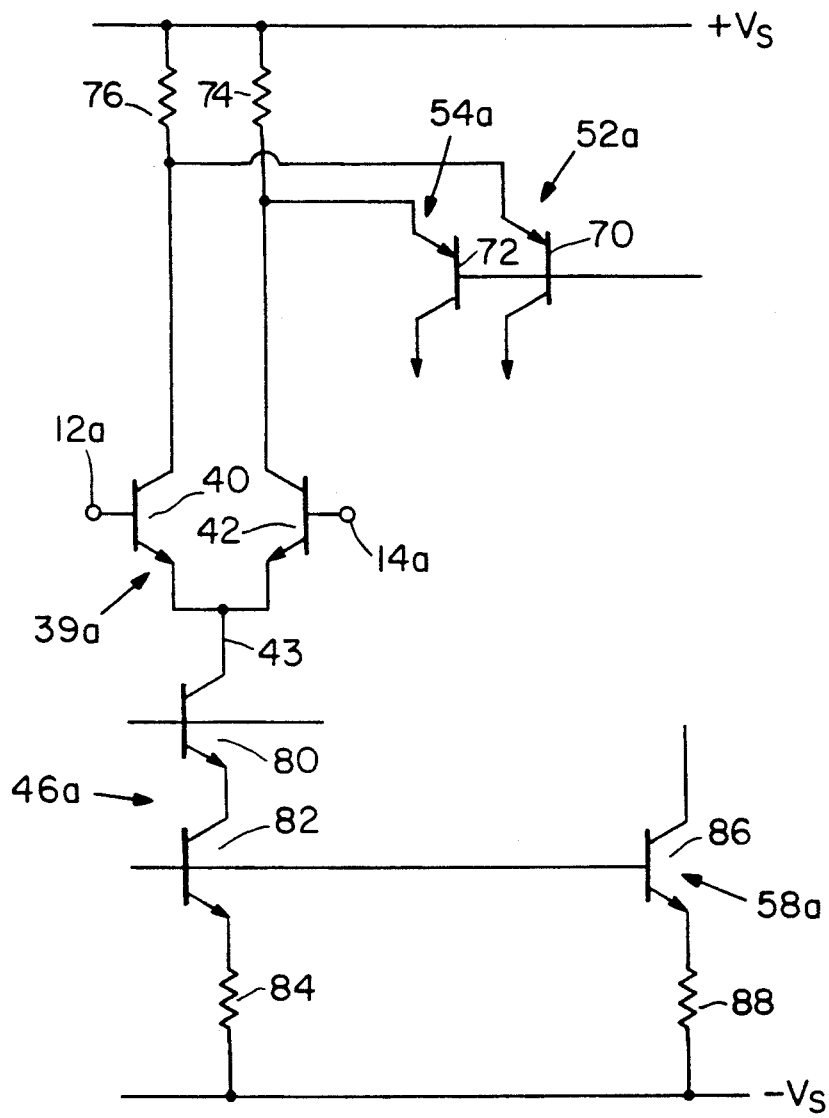
FIG. 3 is a schematic diagram of a portion of the system of FIG. 2 showing the biasing circuits in greater detail.

Biasing circuits 46, 50, 52, and 58, FIG. 2, may be implemented as shown in FIG. 3, where biasing circuits 52a and 54a each include a PNP transistor 70, 72 in conjunction with emitter resistors 74 and 76, respectively. Bias circuit 46 includes a pair of NPN transistors 80, 82 connected in series with the common electrode 43 of differential amplifier 39, along with emitter resistor 84. Bias circuit 58 is implemented as a current source 58a, employing an NPN transistor 86 and emitter resistor 88.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A distortion cancellation amplifier system comprising:

a current mirror circuit having an input, an output and a common terminal;

means for providing a pair of differential current signals to said input and output terminals of said current mirror circuit;

control means, responsive to said output terminal of said current mirror circuit, for controlling the voltage at said common terminal to drive the voltage at said input terminal of said current mirror circuit to track the voltage on said output terminal of said current mirror circuit;

an output amplifier stage having a predetermined gain and having an input and an output terminal with its input terminal connected to said output terminal of said current mirror circuit;

a gain control device having a predetermined impedance connected with said input terminal of said output amplifier; and a distortion suppression device connected between said output terminal of said output amplifier and said input terminal of said current mirror circuit and having an impedance equal to said predetermined impedance of said gain control device divided by said predetermined gain of said output amplifier for cancelling distortion introduced by said output amplifier stage.

2. The distortion cancellation amplifier of claim 1 in which said means for providing a pair of differential current signals includes a voltage to current transconductance amplifier for producing a pair of differential current signals in response to a pair of differential input voltages.

3. The distortion cancellation amplifier of claim 1 in which said means for providing a pair of differential current signals includes first and second bias circuits, one interconnected with each of said input and output terminals of said current mirror circuit.

4. The distortion cancellation amplifier of claim 1 in which said control means includes a voltage follower circuit having its input responsive to said output terminal of said current mirror circuit and its output connected to said common terminal of said current mirror circuit.

5. The distortion cancellation amplifier of claim 1 in which said control means further includes a third bias circuit connected to said common terminal of said current mirror circuit.

6. The distortion cancellation amplifier of claim 1 in which said gain control device includes a capacitor.

7. The distortion cancellation amplifier of claim 1 in which said gain control device includes a resistor.

8. The distortion cancellation amplifier of claim 1 in which said gain control device includes a resistor/capacitor network.

9. The distortion cancellation amplifier of claim 1 in which said gain distortion suppression device includes a capacitor.

10. The distortion cancellation amplifier of claim 1 in which said gain distortion suppression device includes a resistor.

11. The distortion cancellation amplifier of claim 1 in which said gain distortion suppression device includes a resistor/capacitor network.

12. A distortion cancellation folded cascode operational amplifier, comprising:

a current mirror circuit having an input, an output and a common terminal;

means for providing a pair of differential current signals to said input and output terminals of said current mirror circuit;

control means, responsive to said output terminal of said current mirror circuit, for controlling the voltage at said common terminal to drive the voltage at said input terminal of said current mirror circuit to track the voltage on said output terminal of said current mirror circuit;

an output amplifier stage having a predetermined gain and having an input and an output terminal with its input terminal connected to said output terminal of said current mirror circuit;

a gain control device having a predetermined impedance connected with said input terminal of said output amplifier; and a distortion suppression device connected between said output terminal of said output amplifier and said input terminal of said current mirror circuit and having an impedance equal to said predetermined impedance of said gain control device divided by said predetermined gain of said output amplifier for cancelling distortion introduced by said output amplifier stage.

* * * * *

UNITED STATES PATENT AND TRADEMARK OFFICE
CERTIFICATE OF CORRECTION

PATENT NO. : 5,166,637
DATED : November 24, 1992
INVENTOR(S) : Scott A. Wurcer

It is certified that error appears in the above-indentified patent and that said Letters Patent is hereby corrected as shown below:

TITLE PAGE:

Item [57] ABSTRACT: lines 1-2, change "A distortion cancellation amplifier system operational amplifier system" should read --A distortion cancellation operational amplifier system--

Signed and Sealed this

Twenty-third Day of November, 1993

Attest:

BRUCE LEHMAN

Attesting Officer        Commissioner of Patents and Trademarks